United States Patent [19]
Furutani et al.

[11] 4,107,621
[45] Aug. 15, 1978

[54] MICROWAVE SIGNAL AMPLIFIER

[75] Inventors: Nagahisa Furutani, Kawasaki; Kazuo Takahara; Yoshikazu Doi, both of Yokohama; Haruo Yokouchi, Kawasaki, all of Japan

[73] Assignee: Fujitsu Limited, Kawasaki, Japan

[21] Appl. No.: 805,014

[22] Filed: Jun. 9, 1977

[30] Foreign Application Priority Data

Jun. 15, 1976 [JP] Japan ................................ 51/70120

[51] Int. Cl.² ............................................. H03F 3/19
[52] U.S. Cl. ..................................... 330/296; 330/297; 330/306
[58] Field of Search ............... 330/296, 297, 302, 303, 330/304, 305, 306, 179, 185, 192

[56] References Cited

U.S. PATENT DOCUMENTS

| 3,434,070 | 3/1969 | Bartnik et al. ....................... 330/305 |
| 3,860,881 | 1/1975 | Etherington et al. ................ 330/302 |

OTHER PUBLICATIONS

Zhavoronkov et al, "Transistor Microwave Amplifier having a Passband," *Instruments & Experimental Techniques*, vol. 15, No. 3, Pt. 1, May–Jun. 1972, pp. 768–769.
Koppen, "Three-Stage 15 W Power Amplifier for the 470 MHz Communication Band," *Electronic Applications*, vol. 30, No. 4, 1970, pp. 121–130.

Primary Examiner—James B. Mullins
Attorney, Agent, or Firm—Staas & Halsey

[57] ABSTRACT

A microwave signal amplifier comprising transistor having input and output terminals further includes input and output matching circuits connected to the input and output terminals, respectively, and corresponding bias supply circuits connected in parallel between said transistor and said input and output matching circuits, respectively. The input and output matching circuits are each implemented by high pass filters, and the bias supply circuits are each implemented by low pass filters. Furthermore, said high pass and low pass filters respectively have capacitors and inductors connected to the transistor, and said low pass filters have termination resistors.

7 Claims, 5 Drawing Figures

MICROWAVE SIGNAL AMPLIFIER

BACKGROUND OF THE INVENTION

1. Field of the Invention

This invention relates to a microwave signal amplifier utilizing transistors, and particularly relates to a circuit configuration of a microwave signal amplifier which has excellent performance in terms of input/output characteristics and stability of single stage or multi-stage amplifiers.

2. Description of the Prior Art

In general, a single stage $GH_z$ band amplifier utilizing a transistor shows a gain inclination (gain vs. frequency characteristic) of −6 dB/octave when the input and output of the said amplifier are matched within the desired frequency band. In the prior art, such a gain inclination within the desired frequency band has been compensated by the following methods: (1) a method of providing frequency characteristic having an adequate attenuation by adequately mismatching (reducing the gain in the low frequency band) the input and the output matching circuits between the stages of a transistor amplifier within the desired frequency band, and (2) a method of matching the input and output matching circuits within the desired frequency band and adding the constant resistance, amplitude-compensating circuit to the discrete amplifier having a gain inclination of −6dB/octave.

However, in the method (1) mentioned above, the mismatch between the transistor and the input/output matching circuits is considerable within the desired frequency band, as well as in the range of desired frequency band; in the method (2) mentioned above, the mismatch between the transistor amplifier and the input/output matching circuits is also considerable in the range outside of the desired frequency band, and such mismatch makes the amplifier unstable. In other words, the circuit is easily liable to oscillate due to thermal noise, or other noise.

In the microwave signal amplifier utilizing a transistor, as described above, the amplifier becomes unstable if the degree of mismatch between the transistor amplifier and the input circuit (generally including the input matching circuit) and output circuit (generally including the output matching circuit), respectively, is large within the desired frequency band. The reason is as follows.

The input reflection coefficient $\Gamma_{in}$ and output reflection coefficient $\Gamma_{out}$ of the microwave signal amplifier utilizing transistors can be expressed as a function of the S parameters of the discrete transistor as follows:

$$\Gamma_{in} = S_{11} + \frac{S_{12} \cdot S_{21} \cdot \Gamma_L}{1 - S_{22} \cdot \Gamma_L},$$

$$\Gamma_{out} = S_{22} + \frac{S_{12} \cdot S_{21} \cdot \Gamma_S}{1 - S_{11} \cdot \Gamma_S}$$

where $S_{11}$ is the input reflection coefficient when the output is terminated without reflection;

$S_{22}$ is the output reflection coefficient when the input is terminated without reflection;

$S_{12}$ is that transmission coefficient in the reverse direction when the input is terminated without reflection;

$S_{21}$ is that transmission coefficient in the forward direction when the output is terminated without reflection;

$\Gamma_S$ is the reflection coefficient of the input circuit ("power supply" side); and $\Gamma_L$ is the reflection coefficient of the output circuit ("load" side).

Here, the input and output reflection coefficients $\Gamma_{in}$ and $\Gamma_{out}$ of the above-mentioned microwave signal amplifier can be classified, as to their stability or instability, as $|\Gamma|in$, $|\Gamma|out < 1$ (for the stable area), $|\Gamma|in$, $|\Gamma|out > 1$ (for the unstable area). From the above equations, it can be understood that the reflection coefficients $\Gamma_S$ and $\Gamma_L$ of the input/output circuits influence the stability of the microwave signal amplifier. Namely, when the matching of the input/output circuits is bad (thus, the absolute values of $\Gamma_S$ and $\Gamma_L$ are large), the probability of $|\Gamma|_{in}$ or $|\Gamma|_{out}$ being greater than 1 becomes large, thus making the amplifier unstable.

In the microwave signal amplifier, when the frequency becomes high, the gain of the transistor decreases (i.e., the transmission coefficient in the forward direction $S_{21}$ becomes small), and the probability of the unstable condition of the amplifier is seen to be small within that range of the mismatch frequency higher than the desired frequency band. But, in the mismatch frequency range lower than the desired frequency band, the probability of an unstable condition of the amplifier becomes large due to the fact that, as frequency becomes lower, $S_{21}$ of the transistor becomes larger.

In the case of a high power amplifier, such amplifier is often used with a high input level as gain compensate begins. However, when a bipolar transistor (for example, of the common-emitter type) is used, and when the input power exceeds a certain level, an input capacitance between the emitter and the base is pumped by the input signal, and the impedance of the transistor sometimes displays a negative resistance (in this case, $|\Gamma_{in}| > 1|$) for a frequency of $\frac{1}{2}$ or $\frac{1}{3}$ of the input signal frequency. In such a case, when the impedance of the input matching circuit, in the frequency range of $\frac{1}{2}$ or $\frac{1}{3}$ of the input signal frequency, is small, $|\Gamma_S|$ is large and the condition for oscillation is often satisfied.

In the microwave signal amplifier utilizing a transistor, as described above, when $\Gamma_S$, $\Gamma_L$ (namely, a degree of mismatch between the transistor and the input/output matching circuits) is large, the amplifier often becomes unstable. In the prior art, correction of or compensation for this kind of unstable operation of the amplifier has not been sought.

SUMMARY OF THE INVENTION

Considering the above-mentioned disadvantages, the purpose of this invention is to offer a microwave signal amplifier which operates in a stable manner within that range of frequencies outside of, as well as in, the desired frequency band of the amplifier. The microwave signal amplifier of this invention comprises a transistor having input and output matching circuits respectively connected thereto, each matching circuit comprising a high pass filter including a capacitor serially connected in proximity to said transistor. The microwave signal amplifier further includes a bias supply circuit for each matching circuit, each bias supply circuit being connected in parallel between said transistor and said corresponding input/output matching circuit, and including a low pass filter having an inductance serially connected in proximity to said transistor, and a resistor serially connected to said inductance remote from said transistor.

DESCRIPTION OF THE PREFERRED EMBODIMENTS

Figure 1:
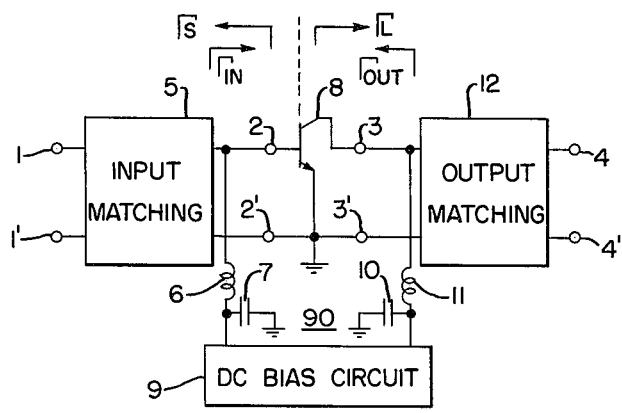
FIG. 1 is a diagrammatic representation of a conventional discrete microwave signal amplifier.

The invention will now be described with reference to FIG. 1, which is a diagrammatic representation of a conventional discrete microwave signal amplifier. The conventional amplifier is seen to comprise input and output matching circuits 5 and 12, respectively; inductances 6 and 11; capacitors 7 and 10; transistor 8; and DC bias circuit 9. In addition, input matching circuit 5 has input terminals 1, 1' and connecting terminals 2, 2' connecting circuit 5 to transistor 8. Output matching circuit 12 has output terminals 4, 4' and connecting terminals 3, 3' connecting transistor 8 to output matching circuit 12. With further reference to FIG. 1, inductances 6, 11 and capacitors 7, 10 form the bias supply circuit 90 which acts as a low pass filter to separate the DC bias circuit 9 from the input/output matching circuits 5, 12 and the microwave circuit (amplifier) transistor 8 insofar as signals of high frequency are concerned. In other words, the bias supply circuit 90 is so configured that it is separated from the remainder of the circuit insofar as signals of high frequency within the desired frequency band of the amplifier are concerned. Transistor 8 is matched or properly mismatched with the input terminals 1, 1' and the output terminals 4, 4' within the desired frequency band of the amplifier by means of the intpu/output matching circuits 5, 12. However, for the reason mentioned above, stability of the amplifier may deteriorate in those frequencies outside of or within the desired frequency band of the amplifier. Namely, if matching of the input/output matching circuits is poor in those frequencies outside of or within the desired frequency band of the amplifier, the absolute values of $\Gamma_S$ and $\Gamma_L$ will be large, causing the possibility of $|\Gamma_{in}|$ or $|\Gamma_{out}|$ being greater than 1 to be relatively large. In conventional amplifiers, a high pass filter is generally used as the input and output matching circuits 5, 12, and, in the case where matching is achieved within the desired frequency band of the amplifier, no particular care has been taken to the low frequency band (i.e., those frequencies outside of the desired frequency band).

Figure 2A:
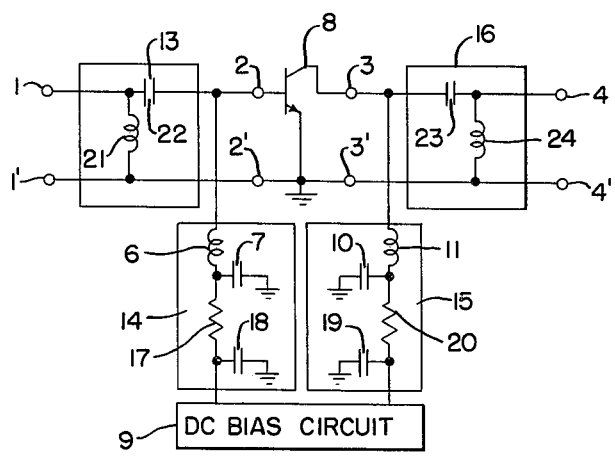
FIGS. 2a and 2b are diagrammatic representations of two embodiments of the discrete microwave signal amplifier of the invention.

FIGS. 2a, b are diagrammatic representations of two embodiments of discrete microwave signal amplifiers according to this invention. In FIGS. 1 and 2a, b, like elements have been given the same reference numerals. In FIGS. 2a, b, the amplifier includes input and output matching circuits 13 and 16, respectively; bias supply circuits 14, 15; resistors 17, 20; capacitors 18, 19, 22, 23; and inductors 21, 24.

The intput matching circuit 13 forms a high pass filter comprising capacitor 22 and inductance 21, while output matching circuit 16 forms a high pass filter comprising capacitor 23 and inductor 24. In this invention, capacitors 22, 23 are connected most proximate to the transistor 8, and the capacitance of each is selected so that all signals of frequency lower than the specified or desired frequency band are stopped. Therefore, to signals of frequency lower than the desired frequency band of the amplifier, the input/output matching circuits 13, 16 appear as open circuits from the transistor 8. In such case, any kind of high pass filter—even if of a configuration other than that shown in FIG. 2 —can be used, so long as the above-mentioned condition is satisfied.

In addition, this high pass filter may be matched within the desired frequency band of the amplifier, or mismatched (so as to flatten the gain vs. frequency characteristic), and the filter is configured so as to provide adequate attenuation in accordance with that purpose.

The bias supply circuits 14, 15 form respective low pass filters comprising inductors 6, 11 in combination with capacitors 7, 10, with inductors 6, 11 being connected most proximate to transistor 8. The low pass filters each have terminating loads made up of resistors 17 and 20, respectively, connected remote from transistor 8. Since the bias supply circuits 14, 15 have inductors 6, 11 connected in proximity to transistor 8, they appear as open circuits to signals within the desired frequency band of the amplifier insofar as high frequency signals are concerned. Thus, high frequency signal separation of the bias supply circuits 14, 15 from the transistor 8 is achieved.

The above-mentioned resistors 17 and 20 in bias supply circuits 14 and 15, respectively, are selected to have a resistance value (Ro) equal to the characteristic impedance (Zo) of the line or some other fixed value. In the case where resistors 17 and 20 are selected to have a resistance value (Ro) equal to the characteristic impedance (Zo) of the line, the microwave signal in the low frequency band and outside of the desired frequency band of the amplifier passes through the low pass filter (inductor-capacitor combinations 6, 7 and 11, 10, respectively), and is terminated without reflection by the resistors 17 and 20, respectively. In this case, it is possible that the impedance of the input circuit 13, when viewed from terminals 2, 2', and that of the output circuit 16, when viewed from terminals 3, 3', are each at a constant impedance (or approximately so) at the lower frequency band, with respect to the specified frequency. As a result, instability of the amplifier based on mismatch, in the mismatch frequency area, between the transistor 8 and the input/output matching circuit 13, 16 can be eliminated. Namely, in this case, $\Gamma_S = 0$, $\Gamma_L = 0$ and $\Gamma_{in} = S_{11}$, $\Gamma_{out} = S_{22}$. Therefore, it is difficult to obtain the relation such as $|\Gamma_{in}| > 1$ or $|\Gamma_{out}| > 1$. The input and output impedances—when viewed from the above-mentioned terminals 2, 2' and 3, 3' —each become constant at frequencies outside of the desired frequency range of the amplifier when the input matching circuit 13 and bias supply circuit 14, as viewed from the terminals 2–2', form a constant resistance branching circuit, and when the output matching circuit 16 and bias supply circuit 15, viewed from the terminals 3–3', form a constant resistance branching circuit. For example, if the input inpedance of the input matching circuit 13 is considered to be $Z_1$, when terminated by the impedance of $R_0$, the input impedance of the bias supply circuit 14 is considered to be $Z_2$, and the resistance value of resistor 17 is equal to the characteristic impedance of the line or $R_0$, the following relations are sufficient to meet the above requirements:

$Z_1 \cdot Z_2 = R_0^2$ (inverse network)

$Z_1 + Z_2 = R_0$ (complementary network)

Figure 2B:
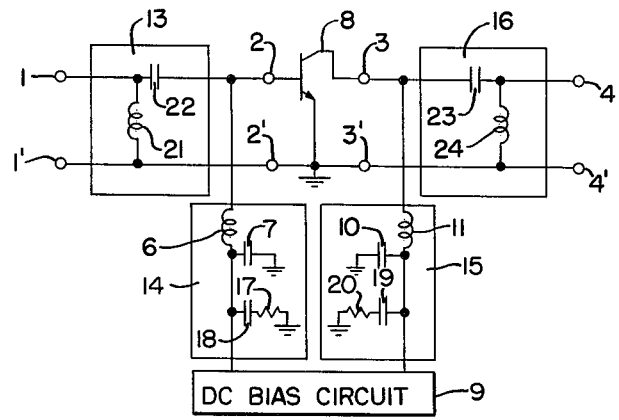

Even if this condition is not perfectly satisfied, sufficient benefit in terms of stability of the amplifier can be obtained by utilizing the configuration of the invention as shown in FIG. 2b which is a diagrammatic representation of a second embodiment of the invention. Then, when the bipolar transistor 8 is used in a common-emitter arrangement, and when input power exceeds a certain level, an input capacitance between the emitter and the base is pumped by the input signal, and the impedance of the transistor 8 shows negative resistance for frequencies of ½ or ⅓ of the input signal, resulting in the condition $|\Gamma_{in}| > 1$. It is, therefore, necessary to select the value of resistors 17 and 20 so that the impedances of the input and output circuits of the transistor 8 do not become equal to the negative resistance value.

In FIG. 2b, the connection of resistor-capacitor combinations 17, 18 and 20, 19 are reversed relative to the corresponding sequence of FIG. 2a. There is no substantial difference between the results achieved by these two arrangements except that, in the case of FIG. 2a, loss of the DC component is considerably large but leak of the high frequency component to the DC bias circuit 9 can be eliminated, while in the case of FIG. 2b, loss of the DC component is almost zero but leak of the high frequency component to the DC bias circuit 9 is more likely to occur.

Figure 3A:
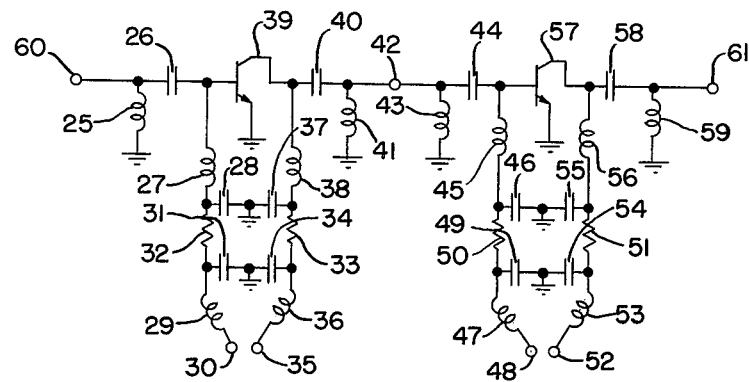
FIGS. 3a and 3b are schematic diagrams of the embodiments of the invention, wherein a pair of discrete amplifiers are cascaded in two stages.

FIGS. 3a and b are circuit schematics of the two embodiments of the invention, wherein two amplifier stages are cascaded. In both FIG. 3a and FIG. 3b, capacitors 26, 40, 44, 58 each combine with inductors 25, 41, 43, 59 (respectively) to form a matching high pass filter having adequate attenuation within the desired frequency band of the amplifier. Inductors 27, 38, 45, 56 similarly combine with capacitors 28, 37, 46, 55 (respectively) to form low filters. Capacitors 31, 34, 49, 54 have sufficiently large capacitance to form bypass capacitors for a sufficiently wider frequency range within or outside the desired frequency band of amplifier; choke coils 29, 36, 47, 53 have sufficiently large impedance within the sufficiently wider frequency range within or outside the desired frequency band of amplifier; and resistors 32, 33, 50, 51 each have resistance values equal to the characteristic impedance and load a corresponding one of said low pass filters (27, 28), (38, 37), (45, 46) and (56, 55). DC bias input terminals 30, 35, 48, 52 are each separated, for AC components, from a corresponding one of the low pass filters (27, 28), (38, 37), (45, 46) and (56, 55) by means of the above-mentioned choke coils 29, 36, 47 and 53, respectively. The embodiments of FIGS. 3a and 3b also include signal input terminals 60, amplifier inter-stage connecting terminal 42, signal output terminal 61, and transistors 39, 57. The input/output impedances as viewed from the transistors 39, 57 are maintained at constant impedance at frequencies lower than the specified or desired frequency.

Figure 3B:
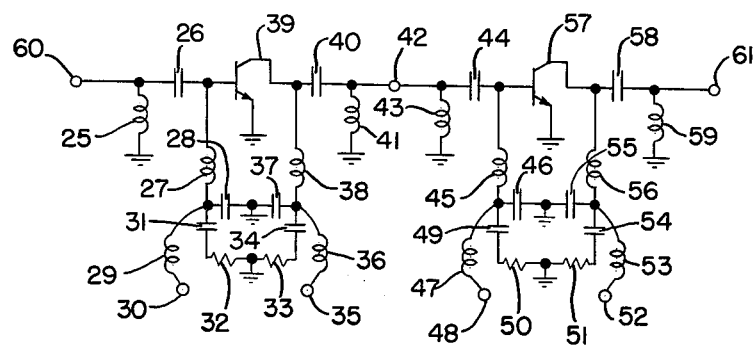

The specific functions of the various elements of FIGS. 3a and 3b, as set forth above, have already been described with respect to FIGS. 2a and 2b, respectively, and will not be repeated here.

It is to be recognized that the input circuit (not illustrated) to be connected to the input side, or signal input terminal 60, generally has an impedance for out-of-band frequency signals (particularly for frequencies as low as ½ or ⅓ of the input signal frequency) different from the characteristic impedance $Z_0$. However, according to the present invention, in accordance with the impedance of the input circuit (when viewed from the transistor 39 in the first stage), low frequency signals outside of the desired frequency band are isolated by the capacitor 26 of the high pass filter (inductor/capacitor combination 25, 26), and can be observed at resistor 32 of the bias supply circuit. Therefore, a low frequency characteristic for out-of-frequency band signals is not required for said input circuit.

Whereas specific embodiments of the invention have been described above, it is to be recognized that various other embodiments equivalent in nature would be obvious in view of the disclosure of this invention, and that the invention is limited only by the appended claimed subject matter.

We claim:

1. A microwave signal amplifier for amplifying a received line signal having predetermined band frequencies to produce an amplified signal output, comprising:

a transistor having an input terminal and an output terminal;

input matching means connected to said input terminal for applying said received line signal to said transistor, said transistor producing an amplified version thereof, said input matching means including a first high pass filter for filtering out low frequency components lower than the predetermined band frequencies and for making an open circuit to said low frequency components from the input terminal;

output matching means connected to said output terminal for converting said amplified version into said amplified signal output, said output matching means including a second high pass filter for filtering out said low frequency components and for making an open circuit thereto from the output terminal; and bias supply means connected to said input and output terminals for supplying DC bias to said transistor, said bias supply means including a pair of low pass filters, each of said low pass filters being terminated by a termination resistor for blocking high frequency components higher than the predetermined band frequencies.

2. A microwave signal amplifier as set forth in claim 1 wherein said first high pass filter comprises a first capacitor connected in series with the input terminal of said transistor, and a first inductor connected in parallel with said input terminal and said first capacitor, and said second high pass filter comprises a second capacitor connected in series with the output terminal of said transistor, and a second inductor connected in parallel with said the output terminal and said second capacitor.

3. A multi-stage microwave amplifier comprising a plurality of microwave signal amplifiers, as recited in claim 2, connected in cascade arrangement.

4. A microwave signal amplifier as set forth in claim 1 wherein said received line signal is received from a transmission line having characteristic impedance $Z_0$, said termination resistor having a resistance $R_0$ equal to $Z_0$.

5. A microwave signal amplifier as set forth in claim 4 wherein said first high pass filter has an input impedance $Z_1$, and said low pass filter for blocking said high frequency components in said received line signal has an input impedance $Z_2$, said $Z_0$, $Z_1$ and $Z_2$ being related as follows:

$$Z_1 \cdot Z_2 = R_0^2$$

$$Z_1 + Z_2 = R_0$$

6. A microwave signal amplifier as set forth in claim 5 wherein said second high pass filter has an output impedance $Z_1$, and said low pass filter for blocking said high frequency components in said amplified version has an output impedance $Z_2$, said $Z_0$, $Z_1$, and $Z_2$ being related as follows:

$$Z_1 \cdot Z_2 = R_0^2$$

$$Z_1 + Z_2 = R_0$$

7. A multi-stage microwave amplifier comprising a plurality of microwave signal amplifiers, as recited in claim 1, connected in cascade arrangement.

* * * * *

UNITED STATES PATENT AND TRADEMARK OFFICE
CERTIFICATE OF CORRECTION

PATENT NO. : 4,107,621
DATED : August 15, 1978
INVENTOR(S) : Nagahisa Furutani et al It is certified that error appears in the above—identified patent and that said Letters Patent are hereby corrected as shown below:

Column 1, line 30, "-6dB/octave" should be --6 dB/octave--.
Column 3, line 40, "intpu" should be --input--.
Column 3, line 64, "intput" should be --input--.

Signed and Sealed this

Twentieth Day of February 1979

[SEAL]

Attest:

RUTH C. MASON
Attesting Officer

DONALD W. BANNER
Commissioner of Patents and Trademarks